United States Patent
Pollard et al.

(10) Patent No.: US 7,655,608 B2
(45) Date of Patent: Feb. 2, 2010

(54) REDUCED METAL ETCH RATES USING STRIPPER SOLUTIONS CONTAINING A COPPER SALT

(75) Inventors: Kimberly Dona Pollard, Anderson, IN (US); Michael T. Phenis, Markleville, IN (US)

(73) Assignee: Dynaloy, LLC, Indianapolis, IN (US)

( * ) Notice: Subject to any disclaimer, the term of this patent is extended or adjusted under 35 U.S.C. 154(b) by 94 days.

(21) Appl. No.: 11/928,754

(22) Filed: Oct. 30, 2007

(65) Prior Publication Data

US 2009/0036344 A1   Feb. 5, 2009

Related U.S. Application Data

(60) Provisional application No. 60/953,804, filed on Aug. 3, 2007.

(51) Int. Cl.
  *C11D 3/30* (2006.01)
  *C11D 3/04* (2006.01)
  *C11D 1/62* (2006.01)

(52) U.S. Cl. .............. 510/176; 510/175; 510/178; 510/254; 510/259; 510/261; 510/264; 134/1.2; 134/1.3

(58) Field of Classification Search ............ 510/175, 510/176, 178, 254, 259, 261, 264; 134/1.2, 134/1.3
See application file for complete search history.

(56) References Cited

U.S. PATENT DOCUMENTS

| | | | |
|---|---|---|---|
| 4,787,997 A * | 11/1988 | Saito et al. ............ 252/79.4 |
| 5,304,284 A * | 4/1994 | Jagannathan et al. ...... 216/89 |
| 5,419,779 A | 5/1995 | Ward ...................... 134/28 |
| 5,648,324 A | 7/1997 | Honda et al. |
| 5,795,702 A | 8/1998 | Tanabe et al. |
| 5,798,323 A | 8/1998 | Honda et al. |
| 5,928,430 A | 7/1999 | Ward et al. .............. 134/1.3 |
| 6,276,372 B1 | 8/2001 | Lee ........................ 134/1.3 |
| 6,319,835 B1 | 11/2001 | Sahbari et al. |
| 6,372,410 B1 | 4/2002 | Ikemoto et al. |
| 6,531,436 B1 | 3/2003 | Sahbari et al. |
| 6,579,668 B1 | 6/2003 | Baik et al. |
| 6,638,694 B2 | 10/2003 | Ikemoto et al. |
| 6,846,748 B2 | 1/2005 | Chien et al. |
| 6,872,663 B1 | 3/2005 | Okada |
| 6,878,500 B2 | 4/2005 | Rutter, Jr. et al. |
| 2001/0014534 A1 | 8/2001 | Aoki et al. |
| 2002/0037819 A1 | 3/2002 | Sahbari |
| 2002/0152925 A1 * | 10/2002 | Soutar et al. ............ 106/1.22 |
| 2003/0130149 A1 | 7/2003 | Zhou et al. |
| 2003/0181344 A1 | 9/2003 | Ikemoto et al. |
| 2003/0186175 A1 | 10/2003 | Ikemoto et al. |
| 2004/0048761 A1 | 3/2004 | Ikemoto |
| 2004/0081922 A1 | 4/2004 | Ikemoto et al. |
| 2005/0176259 A1 | 8/2005 | Yokoi et al. |

OTHER PUBLICATIONS

International Search Report dated Jan. 12, 2009 from PCT/US2008/071485, 5 pgs.

* cited by examiner

*Primary Examiner*—Charles I Boyer
(74) *Attorney, Agent, or Firm*—Woodard, Emhardt, Moriarty, McNett & Henry LLP

(57) ABSTRACT

Resist stripping agents, useful for fabricating circuits and/or forming electrodes on semiconductor devices for semiconductor integrated circuits with reduced metal etch rates, particularly copper etch rates, are provided with methods for their use. The preferred stripping agents contain low concentrations of a copper or cobalt salt with or without an added amine to improve solubility of the copper or cobalt salt. Further provided are integrated circuit devices and electronic interconnect structures prepared according to these methods.

8 Claims, 2 Drawing Sheets

REDUCED METAL ETCH RATES USING STRIPPER SOLUTIONS CONTAINING A COPPER SALT

This application claims the benefit of U.S. Provisional Application No. 60/953,804, filed Aug. 3, 2007, which is hereby incorporated by reference.

FIELD OF THE INVENTION

The present disclosure relates to a resist stripping agent containing a metal salt for use in fabricating circuits or forming electrodes on semiconductor devices for semiconductor integrated circuits or liquid crystal displays, and further to a process of producing semiconductor devices using the resist stripping agent, the stripping agent providing reduced metal etching during stripping procedures, and further to a process of producing semiconductor devices using the resist stripping agent to produce semiconductor devices without the loss of substantial amounts of metal from metal components.

BACKGROUND

The technology of fabricating semiconductor integrated circuits has advanced with regard to the number of transistors, capacitors and other electronic devices which can be fabricated on a single integrated circuit chip. This increasing level of integration has resulted in large part from a reduction in the minimum feature sizes of the integrated circuits and an increase in the number of layers which make up the integrated circuit. Today's design features, generally referred to as "sub-micron" have dropped below 0.25 microns. The manufacture of integrated circuit components having this reduced size has placed new demands on all aspects of their production including the removal of resists with chemical stripper solutions.

Semiconductor devices for semiconductor integrated circuits or liquid crystal displays are commonly produced by a process including the steps of coating a substrate with a polymeric resist composition; patterning the resist film by exposure to light and subsequent development; etching exposed portions of the substrate using the patterned resist film as a mask to form minute circuits; and removing the resist film from the inorganic substrate. Alternatively, after forming minute circuits, the resist film can be ashed and the remaining resist residues removed from the substrate. A superior stripper solution should quickly remove resist residues and materials at moderate to low temperatures, have an acceptable effect on the all exposed components, have a substantial capacity for the dissolved resist and/or post etch residue to forestall both the precipitation of solids and the early disposal of the stripper solution. A superior stripper solution should also quickly remove resist residues in a rework process without substrate damage. Finally, superior stripper solutions should exhibit minimal toxicity.

A variety of stripper solutions have been developed which have performed satisfactorily in the manufacture of the early semiconductor devices. A substantial number of the early stripper solutions have been strongly alkaline solutions. The use of the alkaline stripper solutions to manufacture microcircuits containing metals, particularly tungsten or copper and its alloys with aluminum, can lead to metal loss. Various forms of metal loss, such as for example corrosion whiskers, pitting and notching of metal lines, have been observed during the use of these alkaline strippers. In the case of tungsten and copper, corrosion can occur in the heated dry organic stripping composition mixtures with dissolved oxygen providing the cathodic reaction. Although such metal losses were acceptable in the manufacture of the early semiconductor devices, devices having sub-micron components cannot tolerate such metal losses.

Efforts have been made to reduce the loss of metal during the fabrication of semiconductor devices by utilizing stripper solutions containing a variety of corrosion inhibitors. U.S. Pat. Nos. 6,276,372; 6,221,818; and 6,187,730 teach the use of a variety of gallic compounds which function as corrosion inhibitors in stripper solutions. U.S. Pat. Nos. 6,156,661 and 5,981,454 teach the use of an organic acid as a corrosion inhibitor in stripper solutions. U.S. Pat. Nos. 6,140,287; 6,000,411; and 6,110,881 teach the use of chelating agents as corrosion inhibitors in stripper solutions. U.S. Pat. Nos. 5,902,780; 5,672,577; and 5,482,566 teach the use of dihydroxybenzene chelating agents as corrosion inhibitors in stripper solutions. U.S. Pat. No. 5,997,658 teaches the use of benzotriazole as a corrosion inhibitor in stripper solutions. U.S. Pat. No. 5,928,430 teaches the use of an gallic acid as a corrosion inhibitor in stripper solutions. U.S. Pat. No. 5,419,779 teaches the use of catechol, pyrogallol, anthranilic acid, gallic acid, and gallic ester as corrosion inhibitors in stripper solutions.

The corrosion inhibitors used thus far generally have a number of drawbacks which can include the following: (a) they are organic compounds not easily removed with a water rinse; (b) substantial quantities of the inhibitors are required and can affect the solution's stripping abilities; (c) inhibitors having chelating properties can adhere to metal and other component surfaces and interfere with performance; and (d) a component's toxicity and lack of biodegradability can make exposure to solutions undesirable and disposal of spent stripper solutions more difficult.

What is needed is a stripper solution containing a component which: (a) can, at very low levels, prevent the dissolution of metals and their alloys, including copper and other metals used in the fabrication of semiconductor devices; (b) is compatible with the stripper solution and doesn't interfere with its operation; (c) can be easily rinsed from a semiconductor device with water and/or a water soluble alcohol, leaving no residues; and (d) has low toxicity and does not negatively impact the biodegradability of the spent stripper solution. This present disclosure addresses and resolves these needs.

SUMMARY

A general object of the present invention is to provide a composition for removing a photoresist from a substrate containing a metallic component such as copper. As used herein, the term resist refers to a photoresist or resist material, a post etch residue, or a combination thereof. The composition includes a stripper solution and a copper salt, the composition having a metal conservation factor (MCF) having a value of $>0$ and $\leq 1$, where MCF is defined as:

$$MCF = \frac{(a-b)}{a}$$

where "a" is an etch rate determined with a stripper solution not containing the copper salt and "b" is an etch rate determined with substantially the same stripper solution containing the copper salt. Other metal salts such as for example, cobalt salts can also be added to stripper solutions to similarly reduce the copper etch rate. A single metal salt or a combination of metal salts can similarly be utilized to reduce the etch rate of copper or another metal.

Preferred copper salts are soluble in the stripper solution selected. If solubility of the copper salt is negligible or marginal, solubility of the salt in the stripper solution can be enhanced by the addition of a monomeric or polymeric amine. Such amine solubilized copper salts similarly reduce copper etch levels. Copper salts having a +1 and +2 valence can be utilized. Examples of copper salts having such valences include CuCl and $Cu(NO_3)_2$. A level of copper salt ranging from about 0.001 g of copper salt for each 100 g of solution to about 0.1 g of copper salt for each 100 g of solution is generally preferred. A level of copper salt ranging from about 0.005 g of copper salt for 100 g of solution to about 0.075 g of copper salt for 100 g of solution is more preferred. A level of about 0.025 g of copper salt for 100 g of solution is most preferred.

Reduced etch rates, as evidenced by a Metal Conservation Factor (MCF) ranging from greater than 0 and less than or equal to 1 has been observed upon adding a copper salt to a variety of stripper solutions, including commercial stripper solutions. Preferred stripper solutions which benefit from the addition of a copper salt are those comprising dimethyl sulfoxide, a quaternary ammonium hydroxide, an alkanolamine, with or without secondary solvent, such as for example a glycol ether.

More preferred compositions including stripper solutions in combination with a copper salt are those comprising dimethyl sulfoxide, a quaternary ammonium hydroxide (the base), an alkanolamine, with or without secondary solvent, such as for example a glycol ether, and having a dryness coefficient (DC) of at least about 1 and more preferably at least about 1.8, where the dryness coefficient is defined by the equation:

$$DC = \frac{\text{mass of base}/\text{mass of solution tested}}{\text{mass of water}/\text{mass of solution tested}}$$

Another object of the present disclosure is to provide a composition for removing a photoresist from a substrate containing metallic copper, said composition comprising a stripper solution, a copper salt, and an amine, said composition providing a lower etch rate than said stripper solution not containing a copper salt. Amines suitable for incorporation into the stripper solution can be monomeric amines and/or polymeric amines. All stripper solutions having the copper salt/amine combination added which have been tested have shown reduced copper etch rates. The copper salt/amine combination is particularly suitable when a copper salt cannot be provided having sufficient solubility in the stripper solution.

Another object of the present disclosure is to provide a method for removing a photoresist from a substrate containing metallic copper. The method includes the steps of providing a substrate having a photoresist and metallic copper thereon, and contacting the substrate with a composition including a stripper solution and a copper salt, the stripper/salt combination having an MCF value of more than 0 and less than or equal to 1 to effect removal of the resist. Contacting the substrate with a composition involves a composition including copper salts of the type discussed above, included in amounts described above, with or without an added amine. Monomeric or polymeric amines can be utilized. Preferred stripper solutions used in the contacting step include are those described above. Other commercial stripper solutions can also be advantageously combined with a copper salt to provide reduced metal etch rates as described below.

The step of contacting can involve immersion of a substrate in a stripper solution or by spraying the stripper solution onto the substrate using a spray tool. Further steps following contacting can involve the additional steps of removing the substrate from contact with the stripper solution and/or rinsing the substrate with an appropriate solvent. During the contacting step, the stripper solution is preferably maintained at a temperature of at least about 50° C. and more preferably at a temperature ranging from about 50° C. to about 85° C.

Another object of the present disclosure is to provide an electronic interconnect structure prepared in part by removing resist residues from a substrate having metal components according to the method described above to produce an interconnect structure with increased levels of intact metal. FIG. 2 illustrates a typical electronic interconnect structure having trenches 1 and 2 interconnected through via 3 within two dielectric layers 5 and 6 separated by a barrier layer 4. Trenches 1 and 2 and via 3 are typically filled with a metal such as copper.

Another object of the present disclosure is to provide an integrated circuit device obtainable in part by processing wafers containing metal components to remove resist residues according to the method described above with reduced metal etching. FIG. 3 illustrates a typical integrated circuit device having a plurality of computer chips illustrated by 1 interconnected through chip routers illustrated by 2.

A still further object of the present disclosure is to provide a method for preparing a stripper solution that provides reduced metal etch rates by providing a container; providing components of a stripper solution; providing a copper or cobalt salt; and adding the components and the metal salt to the container to provide contents within the container. Providing components can include providing individual components, a composition containing various components, or combinations thereof. Further, adding components of a stripper solution can involve adding individual components, premixed components, and/or a preformed stripper solution containing provided components in substantially any order. A container can include substantially any vessel capable of holding a stripper solution and includes a typical container used for shipping or transporting a liquid product, equipment used to contain stripper solutions for use processing substrates to remove photoresists and/or etch residues. As used herein a vessel includes equipment used to hold and/or transport a stripper solution during the processing of substrates and includes, but is not limited to, holding and transfer vessels including any pipe system used to transport a stripper solution.

DESCRIPTION

For the purposes of promoting an understanding of the present disclosure, references will now be made to the embodiments illustrated and specific language will be used to describe the same. It will nevertheless be understood that no limitation of the scope of what is claimed is thereby intended, such alterations and further modifications and such further applications of the principles thereof as illustrated therein being contemplated as would normally occur to one skilled in the art to which the disclosure relates.

Figure 1:
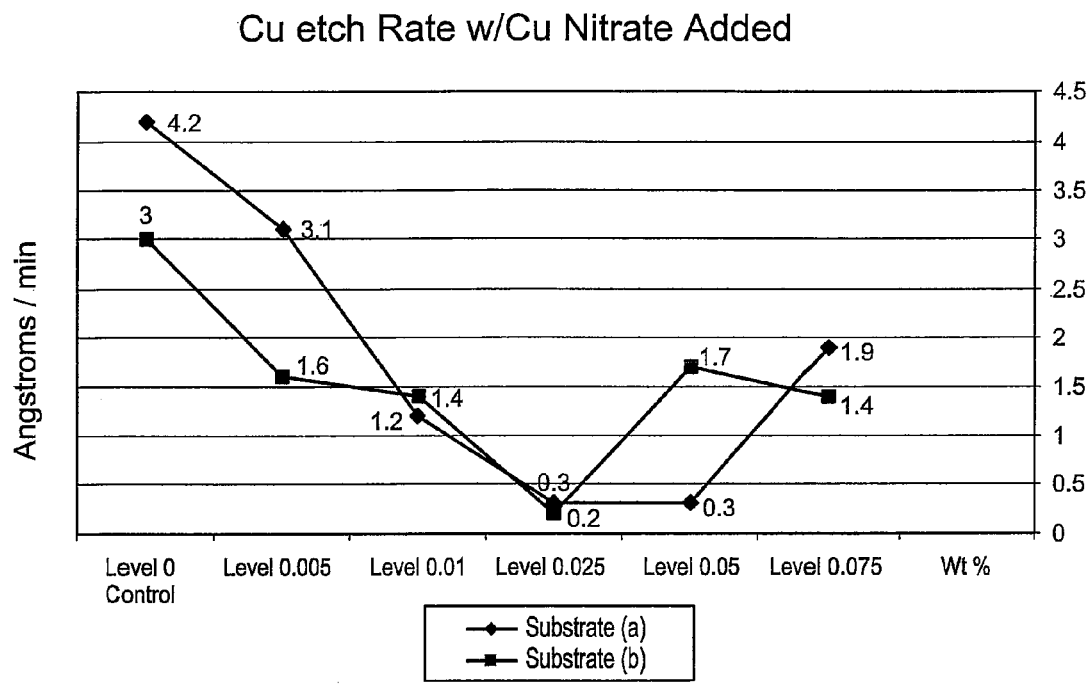
FIG. 1 illustrates a graphic representation of the relationship between the copper salt content of a stripper solution and the copper etch rate which occurs upon exposing that solution to a substrate having exposed copper metal.
Figure 2:
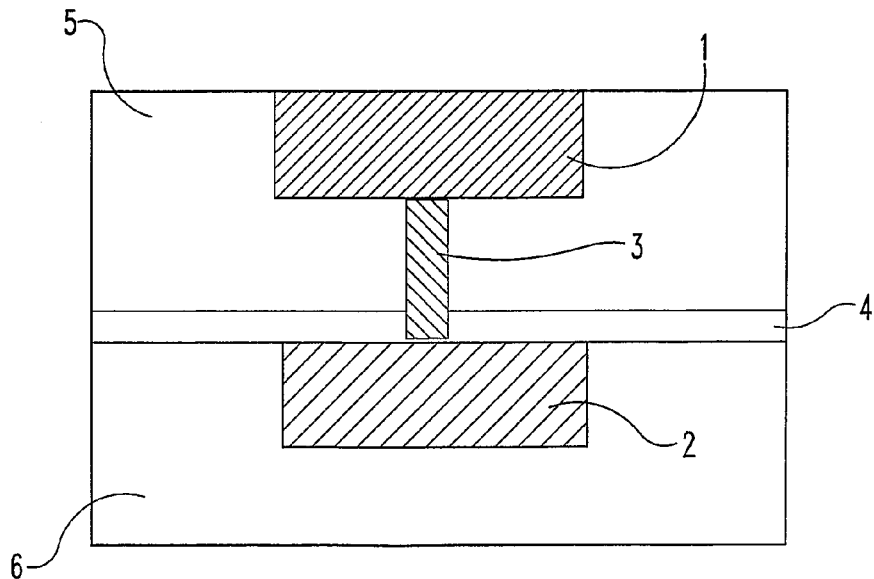
FIG. 2 illustrates an electronic interconnect structure.
Figure 3:
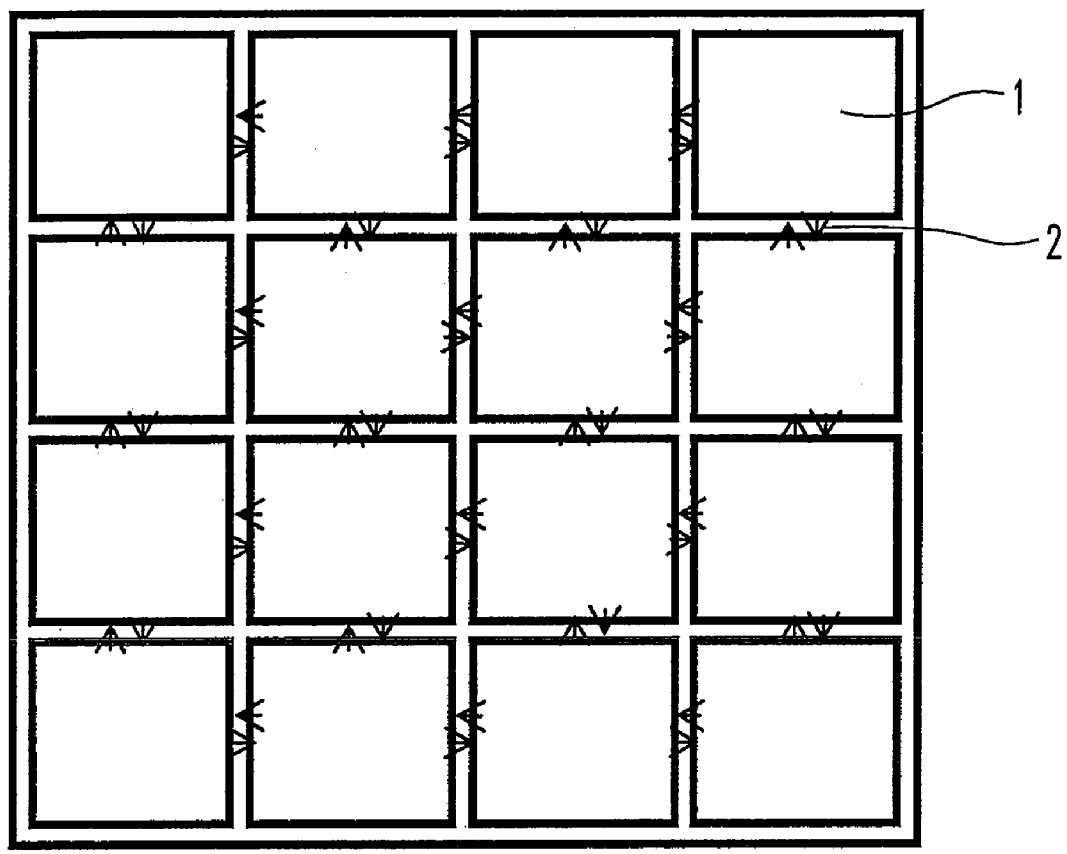
FIG. 3 illustrates an electronic device containing a plurality of electronic interconnect structures.

The compositions according to this present disclosure include a stripper solution containing a copper salt with or without an amine. Such compositions have a copper conservation factor of more than 0 and less than or equal to 1, illustrating a reduction in the etch rate of metallic copper from a copper containing substrate in contact with the composition. Preferred stripper solutions include those comprising dimethyl sulfoxide, a quaternary ammonium hydroxide, an alkanolamine, with or without secondary solvent such as for example a glycol ether. Preferred alkanolamines have at least two carbon atoms, at least one amino substituent and at least one hydroxyl substituent with the amino and the hydroxyl substituents attached to different carbon atoms. A preferred quaternary ammonium hydroxides is tetramethylammonium hydroxide. FIG. 1, based on data from Example 1 illustrates the effect of differing concentrations of a copper salt on stripper solutions containing dimethyl sulfoxide, monoethanolamine, tetramethylammonium hydroxide, 3-methyl-3-methoxybutanol, and a small amount of water on the etch rate of metallic copper. The test was carried out on substrates containing metallic copper obtained from two sources. For the preferred stripper solutions, the copper etch rate was lowest at about 0.025 g of $Cu(NO_3)_2$ for 100 g of the stripper solution. The copper conservation factors for the different solutions containing differing amounts of copper salts ranged from 0.26 to 0.93.

Reductions in the metal etch rate can be achieved by reducing the water content of the preferred stripper solution and by adding a copper salt. A combination of a dry stripper solution and the addition of a copper salt can provide an additive benefit as illustrated in Example 2. Stripper solutions C and D differed only in the amount of water. As can be seen from Table II, lowering the water content as reflected in each solution's dryness coefficient, reduced the copper etch rate. The addition of 0.025 weight % of $Cu(NO_3)_2$ either maintained a very low copper etch rate or further reduced the copper etch rate to provide a favorable metal conservation factor (MCF).

In Example 3, the copper etch rates and metal conservation factor (MCF) were determined with a variety of the preferred stripper solutions and with stripper solutions based on other commercially available stripper solutions with and without the addition of 0.025 wt % of $Cu(NO_3)_2$. For compositions based on formulas 5, 6, and 7, the copper salt was insoluble and its effect could not be determined. All stripper solutions capable of dissolving the copper salts exhibited reduced copper etch rates and displayed MCF values ranging between 0.18 and 1.00.

In Example 4, a method is provided for overcoming problems of the solubility of the copper salt in stripper solutions unable to dissolve a sufficient amount of the salt. The copper salt was added to the stripper solution designated as formula 7 along with either a monomeric or polymeric amine to provide a homogeneous solution. Copper etch rates were determined using the method described in Example 1 for the stripper solutions containing a copper salt and an amine. The results are provided in Table IV. Each of the amine/copper salt combinations reduced the copper etch rate and provided copper conservation factors of from 0.11 to 0.99. Ethanolamine and linear poly-4-vinylpyridine were the most effective amines combined with $Cu(NO_3)_2$.

In Example 5, the copper etch rates for a stripper solution with and without the addition of a Cu(I) salt was determined using the techniques described above. Without the addition of the Cu(I) salt the copper etch rate was 3.5 Å/min. and with the addition of 0.025 wt. % of CuCl, the copper etch rate dropped to 0.84 Å/min. and provided an MCF value of 0.76.

In Example 6, the effect of a cobalt salt on the copper etch rate was studied on two stripper solutions. For the first solution, the copper etch rate with 0.025 wt. % of $Co(NO_3)_2$ dropped from 3.5 Å/min. to 0.87 Å/min. providing an MCF of 0.75. For the second solution the copper etch rate with 0.025 wt. % of $Co(NO_3)_2$ dropped from 4.0 Å/min. to 1.69 Å/min. providing an MCF value of 0.58.

In Example 7, substrates containing a TiW alloy were subjected to a variety of stripper solutions with and without an added copper salt (copper nitrate). As in the previous examples the metal etch rates were determined for each stripper solution with and without added copper nitrate. Except for formula 7, which caused no etching with or without an added copper salt, all stripper solutions containing an added copper salt provided reduced metal etch rates as evidenced by an MCF value of greater than zero.

Studies carried out thus far have indicated that metal salts such as for example Cu (I) and (II), cobalt and the like, provide substantially reduced metal etch rates for semiconductor substrates containing a variety of metals. The reduction in metal etching of metals such as copper and alloys such as TiW subjected to a stripping solution to remove resist materials is particularly advantageous. For metal salt/stripper solution combinations in which the metal salt is not sufficiently soluble, the addition of an amine has provided solubility for the salt and the metal/amine salt combination has provided reduced metal etch rates. The metal salts, with or without amines, are compatible with a range of stripper solutions, do not interfere with the stripper solution's operation, can be easily rinsed from a semiconductor device or component with water or an alcohol, leaving no residues that could interfere with the device's operation, and finally, the metal salts utilized at very low concentrations do not negatively interfere with the biodegradability of the spent stripper solutions.

While applicant's disclosure has been provided with reference to specific embodiments above, it will be understood that modifications and alterations in the embodiments disclosed may be made by those practiced in the art without departing from the spirit and scope of the invention. All such modifications and alterations are intended to be covered.

EXAMPLES

Example 1

Etch Rates as a Function of Copper Concentration

Stripper solutions A and B were prepared for etch rate studies having the following formulations: Solution A—81.9% dimethyl sulfoxide, 3.0% monoethanolamine, 2.55% tetramethylammonium hydroxide, 10% 3-methyl-3-methoxybutanol, and 2.55% water and Solution B—81.5% dimethyl sulfoxide, 4.5% monoethanolamine, 2.0% tetramethylammonium hydroxide, 10% 3-methyl-3-methoxybutanol, and 2.0% water. A 33% aqueous solution of $Cu(NO_3)_2$ was prepared. Portions of stripper solutions A and B were combined with sufficient copper solution to provide concentrations of copper in the stripper solution of 0.005%, 0.01%, 0.025%, 0.05%, and 0.075%. Control solutions were used in the following etch rate studies having no copper salt added.

Commercial sources of silicon wafers with blanket plasma vapor deposited thin copper films were divided into approximately 2 cm by 2 cm test samples for the study. The copper film thickness of each piece was measured three times using a four point probe and the average film thickness taken as the initial copper film thickness. For each solution tested, three test samples were immersed in a stripper solution for 60 minutes, rinsed and the copper film thickness measured again for each test sample. An average of copper film thickness for each test sample was taken as the resultant copper film thickness. A loss of copper film thickness was determined by subtracting the resultant copper film thickness from the initial film thickness. The loss of copper film thickness (in angstroms) observed in 60 minutes was divided by 60 to give an etch rate in the units of angstroms/minute. Table I below summarizes the etch rates determined for stripper solutions A and B containing different levels of copper salt. FIG. 1 illustrates these results graphically. The copper salt could be added directly to stripper solutions A and B, but dissolution was slow and didn't appear to offer any advantage over adding the salt as an aqueous solution, provided the levels of water were minimized. Similarly, the copper salt could also be dissolved in a compatible component of a stripper solution prior to adding the remaining components.

TABLE I

| Percent $Cu(NO_3)_2$ | Etch Rate for Solution A Angstroms/minute | MCF | Etch Rate for Solution B Angstroms/minute | MCF |
|---|---|---|---|---|
| 0.075 | 1.9 | 0.55 | 1.4 | 0.53 |
| 0.050 | 0.3 | 0.93 | 1.7 | 0.43 |
| 0.025 | 0.3 | 0.93 | 0.2 | 0.93 |
| 0.010 | 1.2 | 0.71 | 1.4 | 0.53 |
| 0.005 | 3.1 | 0.26 | 1.6 | 0.47 |
| Control (0.000) | 4.2 | | 3.0 | |

Example 2

Copper Etch Rates for Different Sources of Copper Wafers in Stripper Formulations Having Different Dryness Coefficients, With and Without the Addition of a Copper Salt Two stripper solutions were prepared having the following components: Solution C—85.5 g of dimethyl sulfoxide, 6.0 g of diethylene glycol monomethyl ether, 2.7 g of aminoethylethanolamine, 2.75 g of tetramethylammonium hydroxide, and 2.75 g of water; Solution D—85.5 g of dimethyl sulfoxide, 6.0 g of diethylene glycol monomethyl ether, 2.7 g of aminoethylethanolamine, 2.75 g of tetramethylammonium hydroxide, and 0.45 g of water. Solution C had a dryness coefficient of 1 and solution D had a dryness coefficient of 11.9. Utilizing the test method described in Example 1, etch rates were determined for each of these solutions with the addition of 0.025% of a copper salt and without addition of the salt (control). Parallel tests were conducted on test samples derived from wafers having copper films applied by physical vapor deposition obtained from two different sources. Table II provides a summary of the etch rates obtained. Although there was some slight variation between wafers obtained from different source, reduced etch rates were observed with solutions having a higher dryness coefficient and with solutions containing 0.025% copper nitrate, regardless of the source of the wafers.

TABLE II

| Stripper Solution | Dryness Coefficient | (a)* Cu Etch Rate (angstroms/minute) | MCF | (b)* Cu Etch Rate (angstroms/minute) | MCF |
|---|---|---|---|---|---|
| C (control - no $Cu(NO_3)_2$) | 1 | 2.6 | | 2.7 | |
| C (with 0.025% $Cu(NO_3)_2$) | 1 | 0.0 | 1.00 | 0.3 | 0.96 |
| D (control - no $Cu(NO_3)_2$) | 11.9 | 0.97 | | 2.5 | |
| D (with 0.025% $Cu(NO_3)_2$) | 11.9 | 0.13 | 0.87 | 0.0 | 1.00 |

*The (a) and (b) etch rates were determined on test samples obtained from two different suppliers.

Example 3

Copper Etch Rates for Copper Wafers in a Variety of Stripper Solution Formulations With and Without the Addition of a Copper Salt A variety of stripper solution formulations provided in Table III below were contacted with test strips of the type described in Example I as described therein. Each formulation was tested with and without added copper salt and the copper etch rates determined. Formulations containing an added copper salt contained 0.025% $Cu(NO_3)_2$. As noted in Table III, the copper salt was not soluble in some formulations.

TABLE III

| Formula # | Formulation | Dryness Coefficient | pH | Copper Etch Rate (Å/min.) without Cu salt | with Cu salt | MCF |
|---|---|---|---|---|---|---|
| 1 | 81.5% DMSO<br>4.5% monoethanolamine<br>2.0% tetramethylammonium hydroxide<br>10% 3-methyl-3-methoxybutanol<br>2.0% water | 1 | 11.38 | 4 | 0.3 | 0.93 |
| 2 | 81.9% DMSO<br>3.0% monoethanolamine<br>2.55% tetramethylammonium hydroxide<br>10% 3-methyl-3-methoxybutanol<br>2.55% water | 1.2 | 11.49 | 3.5 | 0.2 | 0.94 |

TABLE III-continued

| Formula # | Formulation | Dryness Coefficient | pH | Copper Etch Rate (Å/min.) without Cu salt | Copper Etch Rate (Å/min.) with Cu salt | MCF |
|---|---|---|---|---|---|---|
| 3 | 86% DMSO<br>6% diethylene glycol monomethyl ether<br>2.7% tetramethylammonium hydroxide<br>2.5% aminoethylethanolamine<br>2.8% water<br>0.03% surfactant* | 1 | 11.34 | 2.6 | 0 | 1.00 |
| 4 | 88% DMSO<br>6% diethylene glycol monomethyl ether<br>2.7% tetramethylammonium hydroxide<br>2.8% aminoethylethanolamine<br>0.5% water<br>0.03% surfactant* | 11.9 | 11.34 | 1 | 0.13 | 0.87 |
| 5 | 65% DMSO<br>25% monoethanolamine<br>5% tetramethylammonium hydroxide<br>5% water | 1 | 11.80 | 1.2 | Cu salt not soluble | — |
| 6 | 45% DMSO<br>25% monoethanolamine<br>10% tetramethylammonium hydroxide<br>10% 3-methyl-3-methoxybutanol<br>10% water | 1 | 12.03 | 3.3 | Cu salt not soluble | — |
| 7 | 92% DMSO<br>2% tetramethylammonium hydroxide<br>6% water | 0.3 | 11.38 | 43 | Cu salt not soluble | — |
| 8 | 80% DMSO<br>10% N-methylpyrrolidone<br>5.5% methanol<br>4.5% choline | Dryness coefficient not applicable | 11.87 | 47.2 | 38.8 | 0.18 |
| 9 | 29.5% 2-aminoethoxyethanol<br>30% N-methylpyrrolidone<br>5% γ-butryolactone<br>0.5% resorcinol | Dryness coefficient not applicable | 10.82 | 4 | 0.5 | 0.85 |

*Zonyl ® FSO fluorinated surfactant available from E. I. DuPont de Nemours and Company, 1007 Market St, Wilmington Delaware 19898 and "Zonyl" is a registered trademark of that same company.

For some of the stripper solutions, a dryness coefficient was not applicable because the stripper solution contained no quaternary ammonium hydroxide.

Example 4

The Enhancement of Copper Salt Solubility by a Monomeric or Polymeric Amine and Resultant Reduction in Copper Etch Rates As can be seen from Example 3, copper nitrate was not soluble in several of the stripper formulations tested. Solubility of the copper salt in the stripper formulations can be enhanced by the incorporation of a monomeric or polymeric amine along with the copper salt. Several amine/copper salt combinations were investigated with regard to solubility in formula 7 of Example 3 and with regard to the effect of the combinations on the copper etch rate. The etch studies were carried out as described in Example 1. Two approaches were utilized to incorporate the amine/copper salt combination into the stripper solution. The first approach involved preparing a 33.3 wt. % aqueous solution of $Cu(NO_3)_2$ and adding the appropriate amount of solution to a stripper solution containing the amine with agitation. A second approach involved preparing a 50 wt. % aqueous solution of $Cu(NO_3)_2$, adding the appropriate amount of this solution to the appropriate amount of amine and adding the aqueous amine/nitrate solution to the stripper solution with agitation. Other possible methods of addition can be envisioned by one skilled in the art and as a result this disclosure is not intended to be limited by the particular methods provided herein.

As can be seen from the results provided in Table IV, the addition of a monomeric or polymeric amine can enhance the solubility of a copper salt in a stripper solution and reduce the copper etch rate observed for the stripper solution containing the amine/copper salt. In the examples, the amount of DMSO in the formula was reduced by the amount of amine added.

TABLE IV

| Formulation | Solubility of $Cu(NO_3)_2$ | Copper Etch Rate (Å/min.) | MCF |
|---|---|---|---|
| 92 g DMSO<br>2 g tetramethylammonium hydroxide<br>6 g water | Not Applicable | 43 | NA |
| 92 g DMSO<br>2 g tetramethylammonium hydroxide<br>6 g water<br>0.025 g $Cu(NO_3)_2$ | Insoluble | No Results | NA |
| 82 g, DMSO<br>2 g tetramethylammonium hydroxide<br>6 g of water<br>8 g ethanolamine<br>0.025 g $Cu(NO_3)_2$ | Soluble | 0.58 | 0.99 |

TABLE IV-continued

| Formulation | Solubility of $Cu(NO_3)_2$ | Copper Etch Rate (Å/min.) | MCF |
|---|---|---|---|
| 91.5 g, DMSO<br>2 g tetramethylammonium hydroxide<br>6 g of water<br>0.5 g linear poly-4-vinylpyridine*<br>0.025 g $Cu(NO_3)_2$ | Soluble | 0.85 | 0.98 |
| 91.5 g, DMSO<br>2 g tetramethylammonium hydroxide<br>6 g of water<br>0.5 g piperidine<br>0.025 g $Cu(NO_3)_2$ | Soluble | 32.3 | 0.25 |
| 91.5 g, DMSO<br>2 g tetramethylammonium hydroxide<br>6 g of water<br>0.5 g morpholine<br>0.025 g $Cu(NO_3)_2$ | Soluble | 38.1 | 0.11 |

*REILLINE ™ 400 available from Vertellus, Inc. (formerly, Reilly Industries, Inc.), Indianapolis, IN Example 5

Reduced Etch Rates with a Cu(I) Salt

A stripper solution was utilized in this example comprising 81.9% dimethyl sulfoxide, 3.0% monoethanolamine, 2.55% tetramethylammonium hydroxide, 10.0% 3-methyl-3-methoxybutanol, and 2.55% water. The dryness coefficient for the formulation was 1.2. The copper etch rate for this formulation was determined as described above and found to be 3.5 Å/min. CuCl (0.025 parts) was dissolved in 100 parts of a stripper solution and the copper etch rate determined in the manner described. The copper etch rate determined for the solution containing CuCl was 0.84 Å/min and the MCF was determined to be 0.76.

Example 6

The Reduction of Etch Rates with of Cobalt Salt

The stripper solution from Example 5 containing 81.9% dimethyl sulfoxide, 3.0% monoethanolamine, 2.55% tetramethylammonium hydroxide, 10.0% 3-methyl-3-methoxybutanol, and 2.55% water was used in this example to study copper etch rates in the stripper solution with and without the addition of a cobalt salt. Without any added salt the stripper solution had a dryness coefficient of 1.2 and provided a copper etch rate was 3.5 Å/min determined according to the method described above. $Co(NO_3)_2$ (0.025 parts) was added to this stripper solution as a 25 wt % aqueous solution to a stripper solution (100 parts) and the copper etch rate again determined as 0.87 Å/min. The stripper solution containing the cobalt salt had an MCF of 0.75.

The copper etch rate for a second stripper solution comprising 81.5% dimethyl sulfoxide, 4.5% monoethanolamine, 2.0% tetramethylammonium hydroxide, 10.0% 3-methyl-3-methoxybutanol, and 2.0% water and a dryness coefficient of 1.0 was determined to be 4.0 Å/min. $Co(NO_3)_2$ (0.025 parts) was added to this stripper solution as a 25 wt % aqueous solution to a stripper solution (100 parts) and the copper etch rate again determined as 1.69 Å/min. The second stripper solution containing a cobalt salt had an MCF of 0.58.

Example 7

Titanium tungsten (TiW) Etch Rates for TiW Wafers in a Variety of Stripper Solution Formulations With and Without the Addition of a Copper Salt A variety of stripper solutions formulations provided in Table V below were contacted with test strips. The test strips were cleaved from commercial sources of silicon wafers with blanket plasma vapor deposited thin TiW films and were approximately 2 cm by 2 cm in size. The TiW film thickness of each piece was measured three times using a four point probe and the average film thickness was calculated as the initial TiW film thickness. For each solution tested, three test samples were immersed in a stripper solution for 30 minutes, rinsed and the TiW film thickness measured again for each test sample. An average of TiW film thickness for each test sample was taken as the resultant TiW film thickness. A loss of TiW film thickness was determined by subtracting the resultant TiW film thickness from the initial film thickness. The loss of TiW film thickness (in angstroms) observed in 30 minutes was divided by 30 to give an etch rate in the units of angstroms/minute. Each formulation was tested with and without added copper salt and the TiW etch rates determined. The formulations containing an added copper salt contained 0.025% $Cu(NO_3)_2$.

TABLE V

| | | | | TiW Etch Rate (Å/min.) | | |
|---|---|---|---|---|---|---|
| Formula # | Formulation | Dryness Coefficient | pH | without Cu salt | with Cu salt | MCF |
| 1 | 81.5% DMSO<br>4.5% monoethanolamine<br>2.0% tetramethylammonium hydroxide<br>10% 3-methyl-3-methoxybutanol<br>2.0% water | 1 | 11.38 | 5.2 | 1.6 | 0.69 |
| 2 | 81.9% DMSO<br>3.0% monoethanolamine<br>2.55% tetramethylammonium hydroxide<br>10% 3-methyl-3-methoxybutanol<br>2.55% water | 1 | 11.49 | 6.0 | 0.4 | 0.93 |
| 3 | 29.5% 2-aminoethoxyethanol<br>30% N-methylpyrrolidone<br>35% ethylene glycol butyl ether<br>5% γ-butryolactone<br>0.5% resorcinol | Dryness coefficient not applicable | 10.82 | 0.2 | 0.1 | 0.50 |

TABLE V-continued

| Formula # | Formulation | Dryness Coefficient | pH | TiW Etch Rate (Å/min.) without Cu salt | with Cu salt | MCF |
|---|---|---|---|---|---|---|
| 4 | 65% DMSO<br>25% monoethanolamine<br>5% tetramethylammonium hydroxide<br>5% water | 1 | 11.80 | 1.3 | 0.6 | 0.54 |
| 5 | 45% DMSO<br>25% monoethanolamine<br>10% tetramethylammonium hydroxide<br>10% 3-methyl-3-methoxybutanol<br>10% water | 1 | 12.03 | 4.1 | 1.2 | 0.71 |
| 6 | 86% DMSO<br>6% diethylene glycol monomethyl ether<br>2.7% tetramethylammonium hydroxide<br>2.5% aminoethylethanolamine<br>2.8% water<br>0.03% surfactant* | 1 | 11.34 | .4 | 0.7 | 0.75 |
| 7 | 88% DMSO<br>6% diethylene glycol monomethyl ether<br>2.7% tetramethylammonium hydroxide<br>2.8% aminoethylethanolamine<br>0.5% water<br>0.03% surfactant* | 11.9 | 11.34 | 0 | 0 | 0 |

*Zonyl ® FSO fluorinated surfactant available from E. I. DuPont de Nemours and Company, 1007 Market St, Wilmington Delaware 19898 and "Zonyl" is a registered trademark of that same company.

While applicant's invention has been described in detail above with reference to specific embodiments, it will be understood that modifications and alterations in embodiments disclosed may be made by those practiced in the art without departing from the spirit and scope of the invention. All such modifications and alterations are intended to be covered. In addition, all publications cited herein are indicative of the level of skill in the art and are hereby incorporated by reference in their entirety as if each had been individually incorporated by reference and fully set forth.

We claim:

1. A method for removing a resist from a substrate comprising the acts of:
   (a) providing a substrate having a resist and a metal thereon; and
   (b) contacting said substrate with a composition including a stripper solution comprising:
      i) a metal salt selected from the group consisting of a copper salt;
      ii) dimethyl sulfoxide (DMSO)
      iii) a quaternary ammonium hydroxide; and
      iv) an alkanolamine.

2. The method of claim 1, wherein said contacting includes contacting said substrate with a composition having a metal conservation factor (MCF) having a value of >0 and ≦1, said MCF being defined as:

$MCF=(a-b)/a$, where 'a' is an etch rate determined with said stripper solution not containing said metal salt and 'b' is an etch rate determined with said stripper solution containing said metal salt.

3. The method of claim 1, wherein said contacting includes contacting said substrate with a composition including from about 0.001 wt. % to about 0.10 wt. % of a copper salt.

4. The method of claim 3, wherein said contacting includes contacting said substrate with a composition which further includes a secondary solvent.

5. The method of claim 1, wherein said providing a substrate includes providing a substrate wherein said resist is a photoresist.

6. The method of claim 1, wherein said providing a substrate includes providing a substrate wherein said resist is an etch residue.

7. An integrated circuit device obtainable, in part, according to the method of claim 1.

8. An electronic interconnect structure obtainable, in part, according to the method of claim 1.

* * * * *